US009263886B2

(12) United States Patent
Suzuki

(10) Patent No.: US 9,263,886 B2
(45) Date of Patent: *Feb. 16, 2016

(54) INFORMATION PROCESSING APPARATUS AND METHOD FOR SUPPLYING ELECTRICAL POWER

(71) Applicant: SONY CORPORATION, Tokyo (JP)

(72) Inventor: Mamoru Suzuki, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 143 days.

This patent is subject to a terminal disclaimer.

(21) Appl. No.: 14/022,511

(22) Filed: Sep. 10, 2013

(65) Prior Publication Data

US 2014/0049116 A1  Feb. 20, 2014

Related U.S. Application Data

(63) Continuation of application No. 13/731,336, filed on Dec. 31, 2012, now Pat. No. 8,732,492, which is a continuation of application No. 12/772,768, filed on May 3, 2010, now Pat. No. 8,370,655.

(30) Foreign Application Priority Data

May 11, 2009 (JP) .................................. 2009-114194

(51) Int. Cl.

| G06F 3/042 | (2006.01) |
|---|---|
| H02J 1/00 | (2006.01) |
| G06F 1/28 | (2006.01) |
| H01L 31/02 | (2006.01) |
| G06F 1/32 | (2006.01) |
| G01R 31/40 | (2014.01) |
| H01L 31/044 | (2014.01) |

(52) U.S. Cl.

CPC ... *H02J 1/00* (2013.01); *G06F 1/28* (2013.01); *G06F 1/3206* (2013.01); *G06F 3/042* (2013.01); *H01L 31/02021* (2013.01); *H01L 31/044* (2014.12); *H02S 50/00* (2013.01); *Y02E 10/50* (2013.01); *Y10T 307/691* (2015.04); *Y10T 307/718* (2015.04)

(58) Field of Classification Search

CPC .. H01L 31/02021; H01L 31/044; G06F 3/042
See application file for complete search history.

(56) References Cited

U.S. PATENT DOCUMENTS

| 5,146,081 A | 9/1992 | Heikkinen et al. |
|---|---|---|
| 6,046,514 A | 4/2000 | Rouillard et al. |
| 2008/0258684 A1 | 10/2008 | Shimura et al. |
| 2011/0074337 A1 * | 3/2011 | Adachi .......................... 320/101 |

FOREIGN PATENT DOCUMENTS

| JP | H-05-100809 | 4/1993 |
|---|---|---|
| JP | 2000-181602 | 6/2000 |

* cited by examiner

*Primary Examiner* — Albert Wang
(74) *Attorney, Agent, or Firm* — Hazuki International, LLC

(57) ABSTRACT

An information processing apparatus includes: a plurality of electric power generating elements; detection means for determining whether each of the plurality of electric power generating elements has an electromotive force equal to or higher than a predetermined value; determination means determining an input operation performed by a user by identifying an electric power generating element having an electromotive force below the predetermined value when at least one of the plurality of electric power generating elements is determined as having an electromotive force below the predetermined value according to the detection means; processing means carrying out a process associate with the input operation determined by the determination means; and bypass means which is provided in parallel with the electric power generating elements and through which a current flows when the electric power generating elements have an electromotive force below the predetermined value.

17 Claims, 10 Drawing Sheets

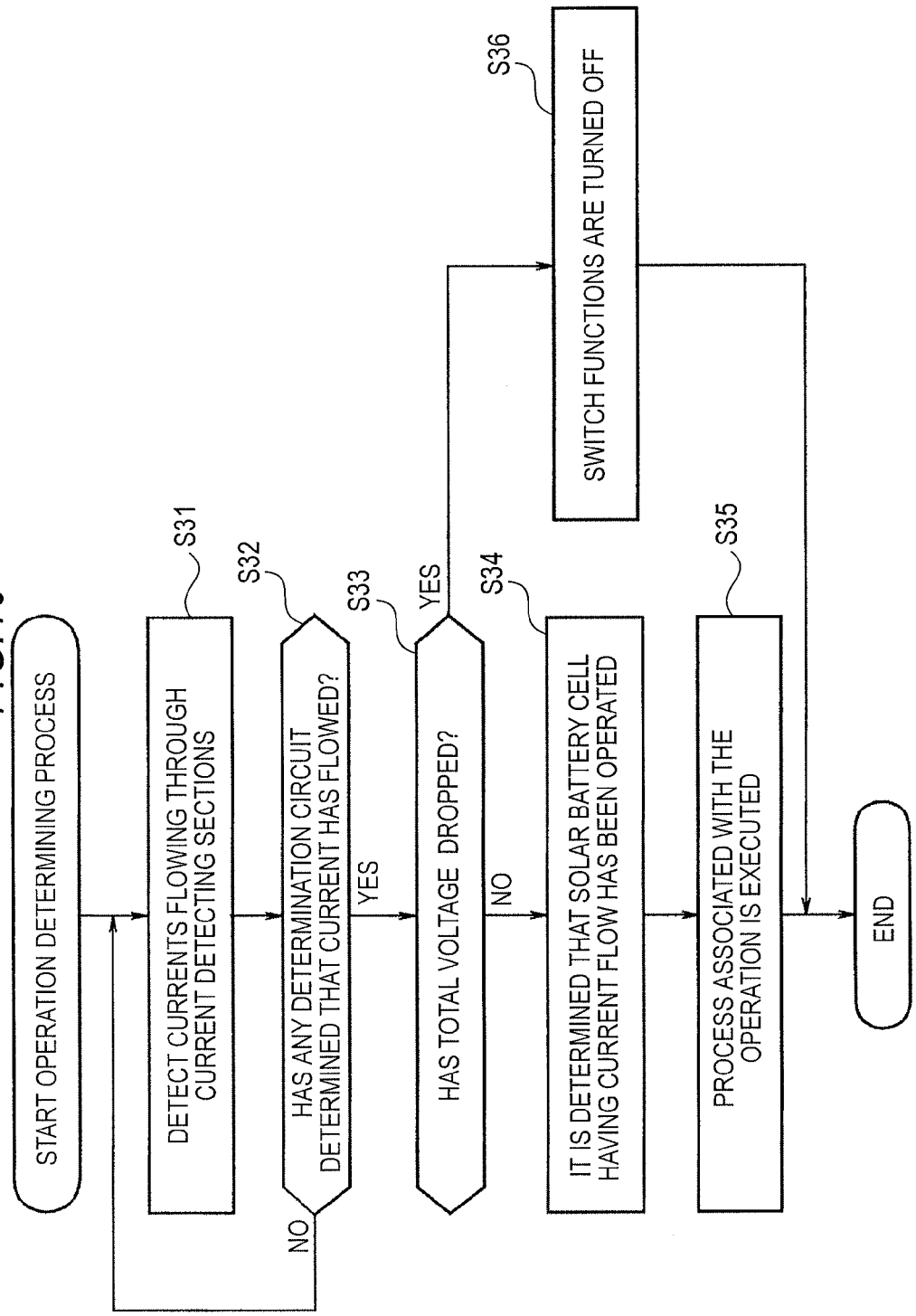

INFORMATION PROCESSING APPARATUS AND METHOD FOR SUPPLYING ELECTRICAL POWER

CROSS-REFERENCE TO RELATED APPLICATIONS

This application is a continuation of U.S. application Ser. No. 13/731,336, filed Dec. 31, 2012, which is a continuation of U.S. application Ser. No. 12/772,768, filed May 3, 2010, now U.S. Pat. No. 8,370,655, issued Feb. 5, 2013, which claims the benefit of priority of Japanese Patent Application No. JP 2009-114194, filed May 11, 2009, the subject matter of each of which is incorporated herein by reference in its entirety.

BACKGROUND OF THE INVENTION

1. Field of the Invention

The present invention relates to an information processing apparatus and an information processing method. More particularly, the invention relates to an information processing apparatus which can be supplied with required electric power even when part of a plurality of series-connected batteries thereof supplies no electricity and to an information processing method for such an apparatus.

2. Description of the Related Art

When an electronic apparatus is provided with user interfaces such as operation buttons, the apparatus can be made easy to operate for a user by assigning a unique purpose to each operation button, e.g., associating the buttons with commands in a one-to-one relationship. However, when a unique purpose is assigned to each operation button, the number of operation buttons increases. Such an approach therefore results in disadvantages in some aspects such as difficulty in making the electronic apparatus compact and increased complicatedness of operations encountered by a user.

In the related art, an optical sensor is sometimes used as a user interface. For example, JP-A-2000-181602 (Patent Document 1) discloses an invention according to which it is determined that an optical sensor has been operated when light radiated from a light emitting portion toward a light receiving portion is interrupted by a user.

SUMMARY OF THE INVENTION

When a compact electronic apparatus is provided with a solar battery, it may be required to provide the solar battery on an outer lateral surface of a housing along with operation buttons. Then, it may not be possible to accommodate a sufficient area for each of the elements. Further, when a plurality of solar batteries are connected in series to obtain required electric power, the required electric power cannot be obtained in such a situation that one of the solar batteries generates no electricity to disallow a current to flow through the entire group of batteries.

Under such circumstances, it is desirable to allow electric power to be supplied with stability by electric power generating elements represented by solar batteries and to provide such electric power generating elements with functions of user interfaces. Thus, space saving can be achieved in an apparatus having such elements.

According to an embodiment of the invention, there is provided an information processing apparatus including a plurality of electric power generating elements, detection means for determining whether each of the plurality of electric power generating elements has an electromotive force equal to or higher than a predetermined value, determination means determining an input operation performed by a user by identifying an electric power generating element having an electromotive force below the predetermined value when at least one of the plurality of electric power generating elements is determined as having an electromotive force below the predetermined value according to the detection means, processing means carrying out a process associate with the input operation determined by the determination means, and bypass means which is provided in parallel with the electric power generating elements and through which a current flows when the electric power generating elements have an electromotive force below the predetermined value.

The plurality of electric power generating elements may be connected in series. The apparatus may further include supplying means supplying the value of a total electromotive force of the plurality of electric power generating elements to the determination means. The determination means may determine the input operation when the value of the total electromotive force supplied by the supplying means is equal to or higher than a predetermined value.

The detection means may detect an electromotive force of the electric power generating element.

The detection means may be connected in series with the bypass means to detect a current flowing through the bypass means.

The electric power generating elements may be solar battery cells.

The information processing apparatus may be incorporated in a mobile telephone.

The information processing apparatus may form part of an IC card.

According to another embodiment of the invention, there is provided an information processing method of an information processing apparatus including a plurality of electric power generating elements, detection means, determination means, processing means, and bypass means provided in parallel with the electric power generating elements. The method includes the steps of determining by the detection means whether each of the plurality of electric power generating elements has an electromotive force equal to or higher than a predetermined value, identifying an electric power generating element having an electromotive force below the predetermined value and determining an input operation performed by a user by the determination means when at least one of the plurality of electric power generating elements is determined as having an electromotive force below the predetermined value according to the detection means, carrying out a process associate with the input operation by the processing means, and causing a current to flow through the bypass means when the electric power generating elements have an electromotive force below the predetermined value.

In the information processing apparatus and method according to the embodiments of the invention, it is determined whether each of a plurality of electric power generating elements has an electromotive force equal to or higher than a predetermined value. An input operation performed by a user is determined by identifying an electric power generating element having an electromotive force below the predetermined value when it is determined that at least one of the electric power generating element has an electromotive force below the predetermined value. A process is carried out based on the determination. The apparatus is configured such that a current flows through a bypass provided in parallel with an electric power generating element when the electric power generating element has an electromotive force below the predetermined value.

According to the embodiments of the invention, electric power can be supplied with stability by electric power generating elements which are typically solar batteries, and such electric power generating elements can be provided with functions of user interfaces.

BRIEF DESCRIPTION OF THE DRAWINGS

FIG. 10 is a flow chart for explaining processes associated with determination of an operation.

DETAILED DESCRIPTION OF THE PREFERRED EMBODIMENTS

Embodiments of the invention will now be described with reference to the drawings.

[Configuration of Mobile Information Processing Apparatus]

Figure 1:
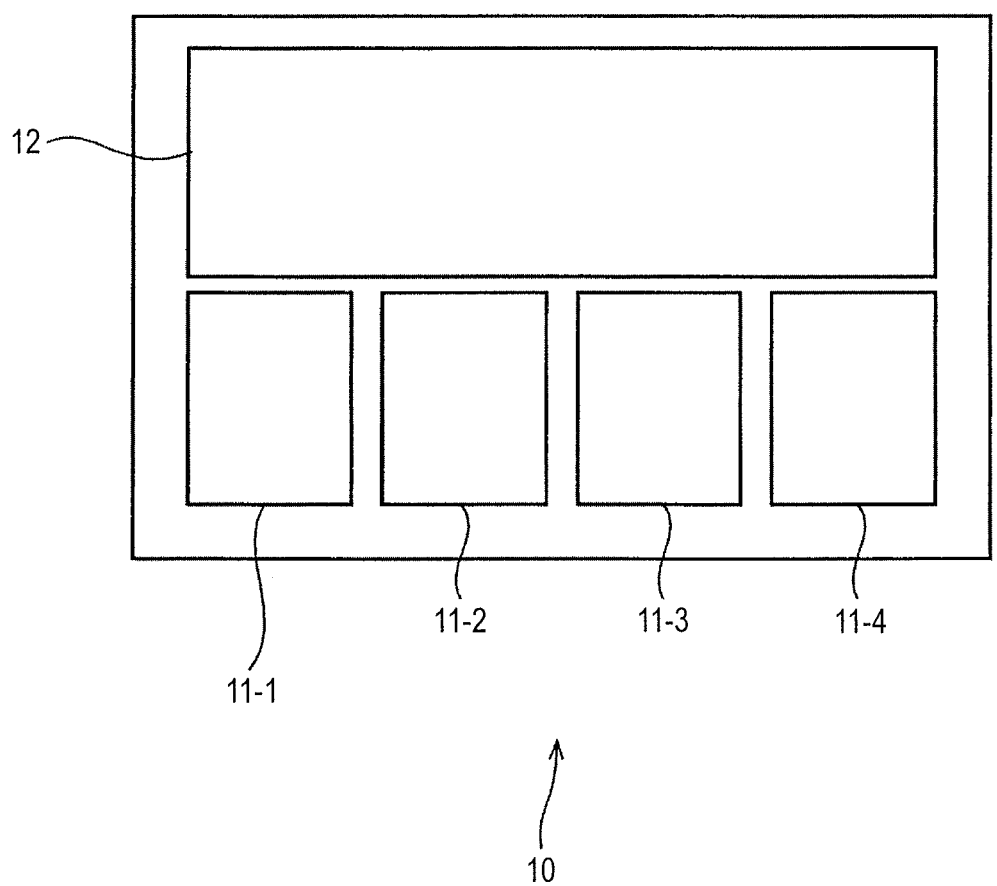
FIG. 1 is a diagram showing a configuration of an embodiment of a mobile information processing apparatus according to the invention.

FIG. 1 is a schematic illustration of a mobile information processing apparatus 10 that is an embodiment of the invention. For example, the mobile information processing apparatus 10 is an IC (integrated circuit) card having the same size as that of credit cards, and the apparatus includes a plurality of solar cells (four solar cells in the embodiment shown in FIG. 1) 11-1 to 11-4 and a display 12 for displaying predetermined information provided on an outer lateral surface thereof. The mobile information processing apparatus 10 having such a configuration may be used as a device which forms part of a mobile phone.

At least one command is associated with each of the solar cells 11-1 to 11-4. The commands are identified by states of power generation at the solar cells 11-1 to 11-4. When a user wishes to input any of the command, the command can be input by performing an operation such as covering some of the solar cells 11-1 to 11-4. As a result, the solar cells 11-1 to 11-4 can be used as user interfaces, and there is no need for disposing buttons or the like on an outer surface of the mobile information processing apparatus 10.

The number of commands assigned to each of the solar battery cells 11-1 to 11-4 may be arbitrarily set. For example, one command may be assigned to each solar battery cell 11. Alternatively, a plurality of commands may alternatively be assigned to each cell, and determination as to which of the cells is selected may be made according to the number of user inputs. Further, the meaning of one command may be represented by a combination of plural solar battery cells 11. Thus, the small number of solar battery cells 11 can be combined to define various commands, and the number of the commands thus defined may exceed the number of cells.

A description will now be made on a configuration of the mobile information processing apparatus 10 of the present embodiment and operations of the apparatus to achieve the functions as thus described.

The solar battery cells 11-1 to 11-4 not only convert light irradiating them into electric power but also function as user interfaces. Specifically, when any of the solar battery cells 11-1 to 11-4 is covered by a finger of a user, the action is detected as a selecting operation performed by the user, and a process associated with the operation is performed. Hereinafter, the solar battery cells 11-1 to 11-4 may be simply referred as "solar battery cells 11" when there is no need for distinguishing the cells from each other. Reference numerals assigned to other parts of the apparatus may be similarly given in such abbreviated forms.

The solar battery cells 11 converting irradiating light into electric power may be replaced by electric power generating elements which convert heat generated from light irradiating them into electric power. The invention is not limited to the use of four solar battery cells 11. For example, electronic paper or a liquid crystal panel may be used as the display 12.

Figure 2:
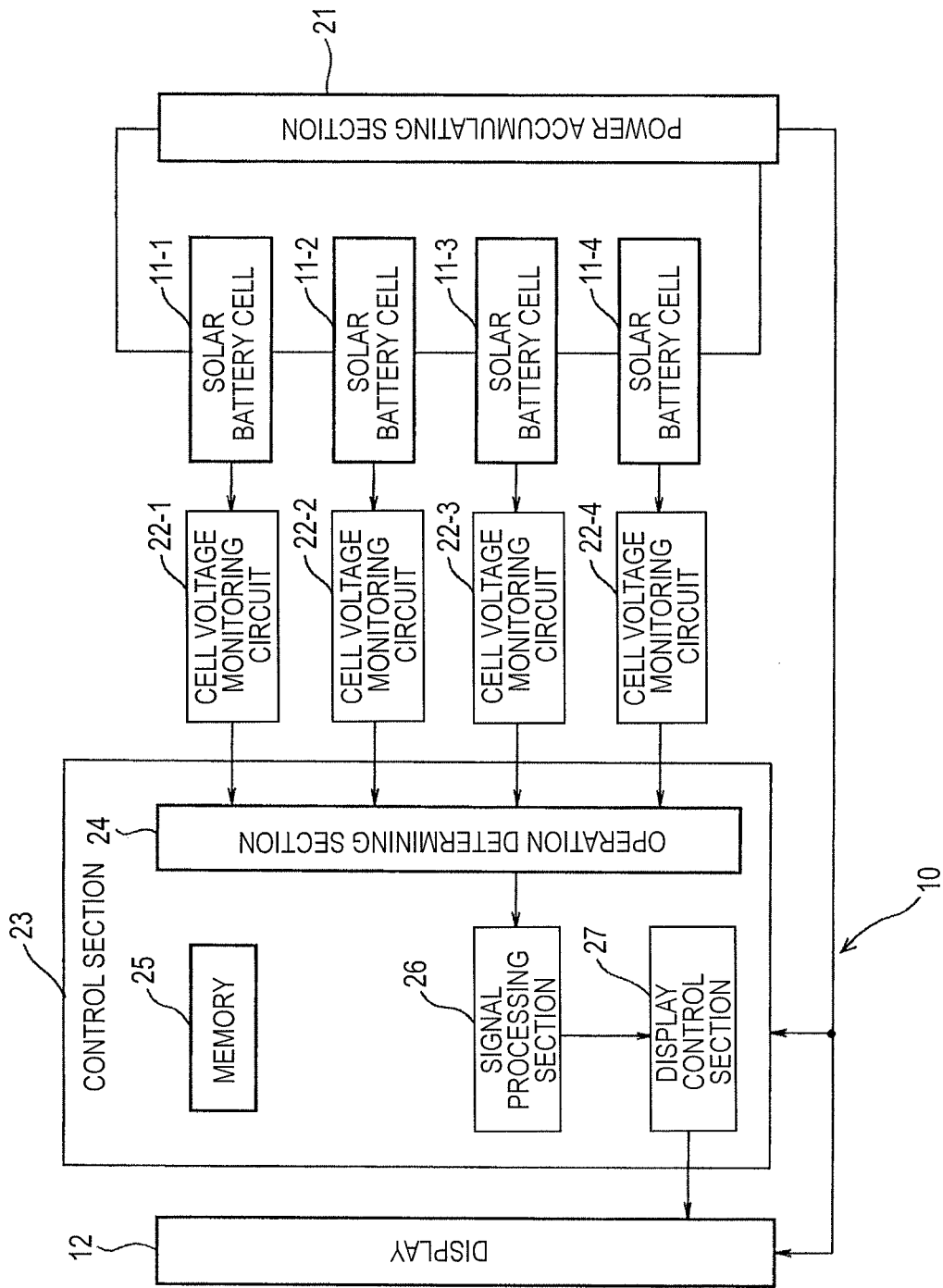
FIG. 2 is a diagram showing an exemplary configuration of the mobile information processing apparatus.

FIG. 2 shows an exemplary configuration of the mobile information processing apparatus 10. In addition to the solar battery cells 11 and the display 12 provided on the outer lateral surface as described above, the mobile information processing apparatus 10 may include a power accumulating section 21 which supplies electric power obtained from the solar battery cells 11 to parts of the apparatus provided downstream of the section in a stable manner and a control section 23 which executes processes according to operations performed by a user on the solar battery cells 11 serving as user interfaces.

A cell voltage monitoring circuit 22-1 detects the voltage of electric power generated by the solar battery cell 11-1 and notifies an operation determining section 24 in the control section 23 of the voltage. The solar battery cell 11-1 outputs the electric power generated by itself to the power accumulating section 21. The solar battery cells 11-2 to 11-4 are similar to the solar battery cell 11-1 in configuration. The solar battery cells 11-1 to 11-4 are connected in series. The cells are configured such that desired electric power can be obtained when they are connected in series.

The power accumulating section 21 is constituted by a storage battery or capacitor. The section accumulates electric power from the solar battery cells 11-1 to 11-4 to obtain a desired voltage and supplies the electric power to the display 12 and the control section 23 provided downstream of the section.

The control section 23 executes programs held in a memory 25 incorporated in itself to implement an operation determining section 24, a signal processing section 26, and a display control section 27 on a software basis. The operation determining section 24 determines whether any of the solar battery cells 11-1 to 11-4 has been operated by a user (for example, covered by a finger) based on results of detection performed by cell voltage monitoring circuits 22-1 to 22-4, and the section notifies the signal processing section 26 of the result of the determination. The signal processing section 26 performs a process according to the determination results thus informed and outputs the result of the process to the display control section 27.

For example, when the mobile information processing apparatus 10 is provided with such a function, various services can be implemented using the mobile information processing apparatus 10, including electric money settlement services and services for providing various types of information such as weather forecasts. When the content of services provided to a user changes depending on applications to be executed, it becomes necessary to change commands in accordance with services to be provided. In such a case, commands assigned to the solar battery cells 11 may be changed depending on applications to be executed.

Assigning no command to some of the solar battery cells is an approach which can be taken in such a case, and it is also possible to assign one command to a combination of plural solar battery cells 11. Further, different processes may be performed depending on modes of inputs from a user. For example, the apparatus may be set up such that different commands will be input depending on the number of times the same solar battery cell 11 is covered or the order in which the solar battery cells 11 are covered.

The mobile information processing apparatus 10 may be incorporated in a keyboard of a personal computer or a mobile phone to serve as part of such apparatus.

[Circuit Configuration]

Figure 3:
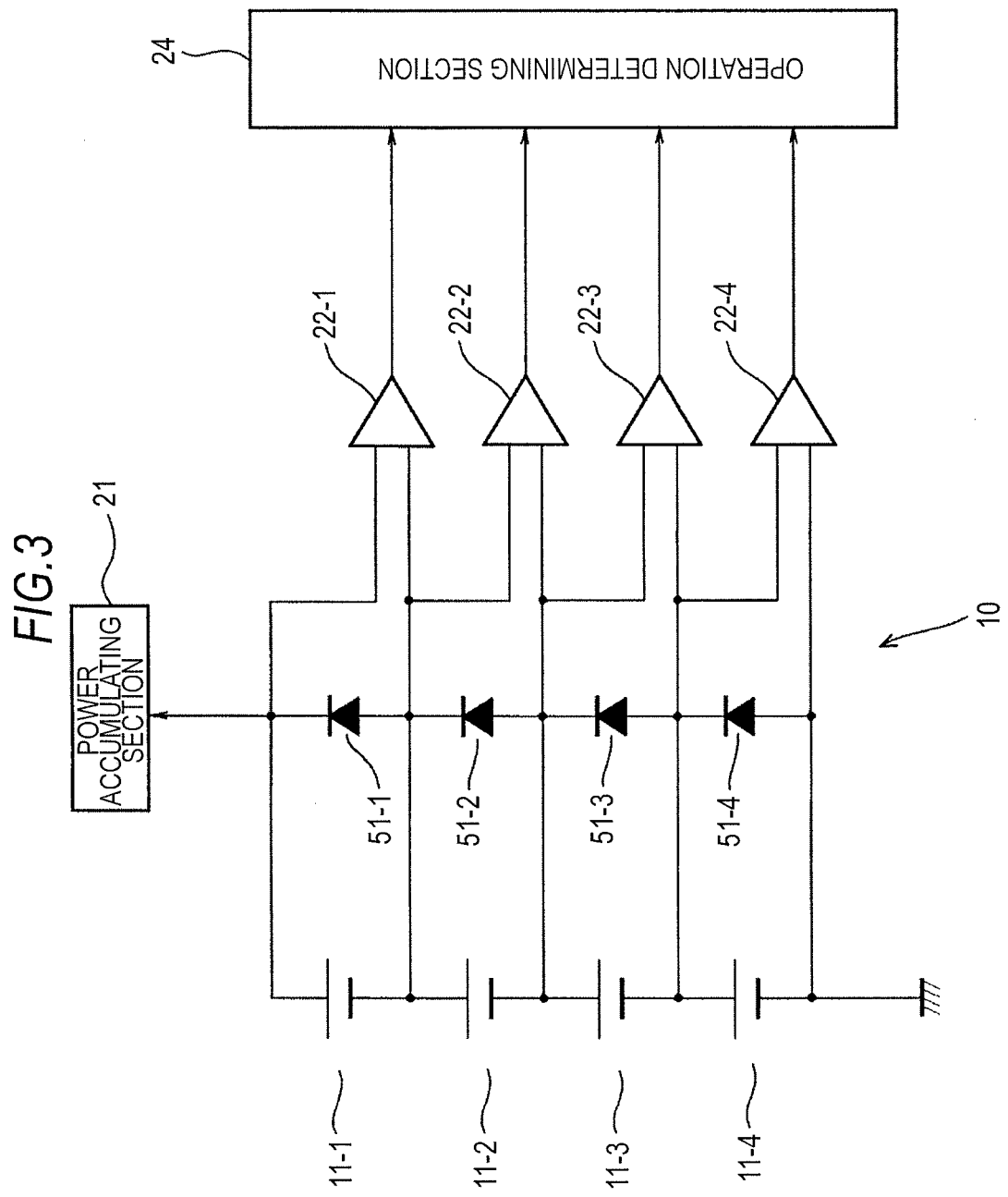
FIG. 3 is a diagram showing an exemplary circuit configuration of the mobile information processing apparatus.

FIG. 3 is a diagram showing an exemplary circuit configuration of the mobile information processing apparatus 10. The solar battery cells 11-1 to 11-4 are connected in series. A negative side of the solar battery cell 11-4 is grounded. A positive side of the solar battery cell 11-4 is connected to a negative side of the solar battery cell 11-3. A positive side of the solar battery cell 11-3 is connected to a negative side of the solar battery cell 11-2. A positive side of the solar battery cell 11-2 is connected to a negative side of the solar battery cell 11-1. A positive side of the solar battery cell 11-1 is connected to one end of the cell voltage monitoring circuit 22-1 on an input side of the circuit.

Another end of the cell voltage monitoring circuit 22-1 on the input side thereof is connected to a negative side of the solar battery cell 11-1 (the positive side of the solar battery cell 11-2). The positive side of the solar battery cell 11-2 is connected to one end of the cell voltage monitoring circuit 22-2 on an input side of the circuit. Another end of the cell voltage monitoring circuit 22-2 on the input side thereof is connected to the negative side of the solar battery cell 11-2 (the positive side of the solar battery cell 11-3).

The positive side of the solar battery cell 11-3 is connected to one end of the cell voltage monitoring circuit 22-3 on an input side of the circuit. Another end of the cell voltage monitoring circuit 22-3 on the input side thereof is connected to the negative side of the solar battery cell 11-3 (the positive side of the solar battery cell 11-4). The positive side of the solar battery cell 11-4 is connected to one end of the cell voltage monitoring circuit 22-4 on an input side of the circuit. Another end of the cell voltage monitoring circuit 22-4 on the input side thereof is connected to the negative side of the solar battery cell 11-4 (ground).

The cell voltage monitoring circuits 22-1 to 22-4 measure voltages (potentials) of the solar battery cells 11-1 to 11-4, respectively. The cell voltage monitoring circuit 22-1 measures the voltage of the solar battery cell 11-1 and outputs the result of the measurement to the operation determining section 24. The cell voltage monitoring circuit 22-2 measures the voltage of the solar battery cell 11-2 and outputs the result of the measurement to the operation determining section 24. The cell voltage monitoring circuit 22-3 measures the voltage of the solar battery cell 11-3 and outputs the result of the measurement to the operation determining section 24. The cell voltage monitoring circuit 22-4 measures the voltage of the solar battery cell 11-4 and outputs the result of the measurement to the operation determining section 24.

Specifically, the cell voltage monitoring circuits 22 calculate a difference between two voltages input thereto and output the result of the calculation to the operation determining section 24. When a voltage is measured as a difference as thus described, the cell voltage monitoring circuits 22 may be differential circuits. For example, when the solar battery cells 11 generate electric power of 1 volt, the cell voltage monitoring circuits 22 output either of numerical values "0" and "1" to the operation determining section 24. For example, when the solar battery cell 11-1 generates an electromotive force, the cell voltage monitoring circuit 22-1 outputs "1" to the operation determining section 24. When the cell generates no electromotive force, the cell voltage monitoring circuit 22-1 outputs "0" to the operation determining section 24.

The cell voltage monitoring circuit 22-1 is not required to measure the electromotive force of the solar battery cell 11-1 exactly, and the circuit may be configured to output "1" when there is an electromotive force equal to or higher than a predetermined value and to output "0" when there is an electromotive force below the predetermined value. Obviously, the circuit may alternatively be configured to output "0" when there is an electromotive force equal to or higher than a predetermined value and to output "1" when there is an electromotive force below the predetermined value. The following description is based on an assumption that the apparatus has the configuration to output "1" when there is an electromotive force equal to or higher than a predetermined value and to output and "0" when there is an electromotive force below the predetermined value.

The solar battery cell 11-1 generates no electromotive force when a user uses the solar battery cell 11-1 as a switch, e.g., when the solar battery cell 11-1 is covered by a finger. Therefore, when the value input from the cell voltage monitoring circuit 22-1 is "0", the operation determining section 24 determines that the solar battery cell 11-1 has been operated as a switch by the user. The other solar battery cells 11-2 to 11-4 and the other cell voltage monitoring circuits 22-2 to 22-4 are similar in configuration to the solar battery cell 11-1 and the cell voltage monitoring circuit 22-1, respectively.

When a solar battery cell 11 is covered by a finger or the like and is thereby disabled from generating an electromotive force, the internal resistance of the solar battery cell increases, and the cell may consequently operate as a pseudo-resistor. For example, when the solar battery cell 11-1 is covered by a finger or the like and is thereby disabled from generating an electromotive force, the internal resistance of the solar battery cell 11-1 increases. Thus, the cell functions as a resistor rather than a power supply, which is undesirable. In such a state, no current flows through the solar battery cell 11-1. As a result, no current flows into the power accumulating section 21, and desired electronic power cannot be obtained.

Figure 4:
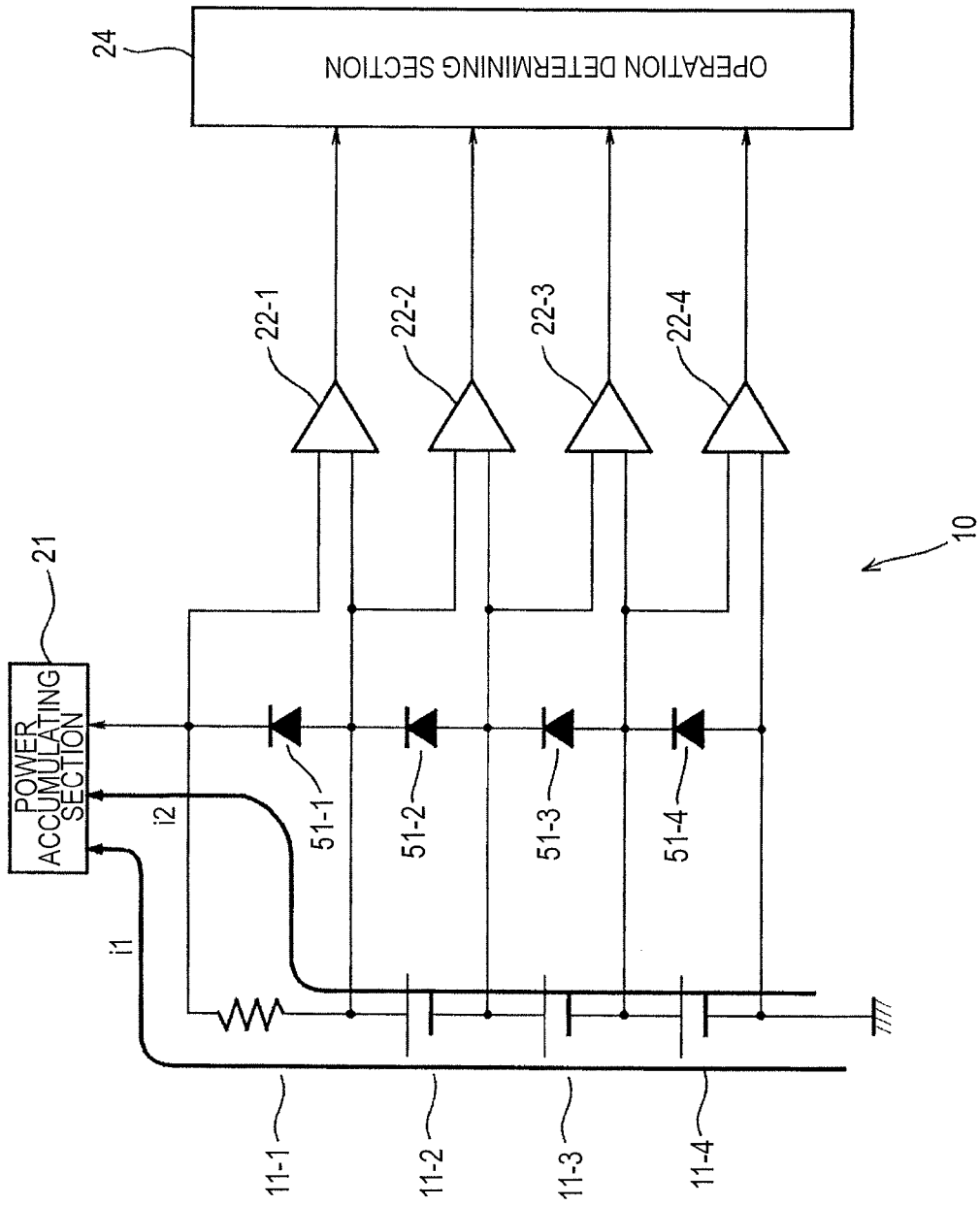
FIG. 4 is a diagram for explaining the flow of currents in the mobile information processing apparatus.

The description will be continued with reference to FIG. 4. When the solar battery cell 11-1 is not covered by a finger and is therefore generating an electromotive force, a current i1 flows into the power accumulating section 21 after flowing through the solar battery cell 11-4, the solar battery cell 11-3, the solar battery cell 11-2, and the solar battery cell 11-1, as shown in FIG. 4. When the solar battery cell 11-1 is covered by a finger, the solar battery cell 11-1 functions as a pseudo-resistor as shown in FIG. 4. When the solar battery cell 11-1 functions as a resistor, the current i1 does not flow through the solar battery cell 11-1. Consequently, no current flows into the power accumulating section 21, and no electric power is accumulated in the power accumulating section 21. In such a state, no electric power is supplied to the mobile information processing apparatus 10, and the apparatus is therefore disabled.

According to the embodiment of the invention, in order to prevent the occurrence of the state in which no current flows into the power accumulating section 21, a bypass diode 51-1 is provided to allow a current i2 to flow, as shown in FIG. 4. Specifically, when the solar battery cell 11-1 functions as a pseudo-resistor, the current i2 flows through the solar battery cell 11-4, the solar battery cell 11-3, the solar battery cell 11-2, and the bypass diode 51-1. As a result, electric power is supplied to the power accumulating section 21.

Referring again to the circuit configuration shown in FIG. 3, the bypass diode 51-1 is provided in parallel with the solar battery cell 11-1. Similarly, a bypass diode 51-2 is provided in parallel with the solar battery cell 11-2. A bypass diode 51-3 is provided in parallel with the solar battery cell 11-3. A bypass diode 51-4 is provided in parallel with the solar battery cell 11-4.

In such a configuration, a current flows through the bypass diode 51-1 when the solar battery cell 11-1 functions as a switch. A current flows through the bypass diode 51-2 when the solar battery cell 11-2 functions as a switch. A current flows through the bypass diode 51-3 when the solar battery cell 11-3 functions as a switch. A current flows through the bypass diode 51-4 when the solar battery cell 11-4 functions as a switch. Thus, the circuit configuration shown in FIG. 3 allows a current to flow into the power accumulating section 21 to accumulate electric power therein even when any of the solar battery cells 11-1 to 11-4 functions as a switch and therefore acts as a pseudo-resistor.

[Configuration with Total Voltage Monitoring Circuit]

When all of the solar battery cells 11-1 to 11-4 are covered by a hand, none of the solar battery cells 11-1 to 11-4 generate electric power, and each of the cell voltage monitoring circuits 22-1 to 22-4 outputs the value "0". In such a state, no electric power is accumulated in the power accumulating section 21, and the mobile information processing apparatus 10 is disabled. However, in a case wherein the mobile information processing apparatus 10 is provided with, for example, a backup electric power section for supplying electric power in such a situation (such a case will be referred to as "first case"), the mobile information processing apparatus 10 operates even in the state in which none of the solar battery cells 11 generate electricity.

Even if no backup electric power section is provided, the mobile information processing apparatus 10 is kept operating for some time by electric power accumulated in the power accumulating section 21 even when each of the cell voltage monitoring circuits 22-1 to 22-4 outputs the value "0" (such a case will be referred to as "second case").

In the first or second case wherein the mobile information processing apparatus 10 operates even though each of the cell voltage monitoring circuits 22-1 to 22-4 outputs the value "0", the operation determining section 24 determines that all of the solar battery cells 11-1 to 11-4 have been operated as switches.

In such a situation, the operation determining section 24 determines that all of the solar battery cells 11-1 to 11-4 have been operated and allows a process associated with the determination to be performed in the first case. Let us assume that a sufficient quantity of light cannot be obtained because, for example, the mobile information processing apparatus 10 has been left in a dark place and that each of the cell voltage monitoring circuits 22-1 to 22-4 consequently outputs the value "0". In such a situation, the operation determining section 24 may determine that all of the solar battery cells 11-1 to 11-4 have been operated, and the process associated with the determination may be executed. That is, the process can be executed in a situation where it should not be executed.

In the second case, when the operation determining section 24 determines that all of the solar battery cells 11-1 to 11-4 have been operated to allow the process associated with the determination to be executed, the amount of electric power accumulated in the power accumulating section 21 may have become too low to execute the process (to allow the mobile information processing apparatus 10 to operate). That is, the process may not be executed even though the execution of the process is instructed by the user.

Figure 5:
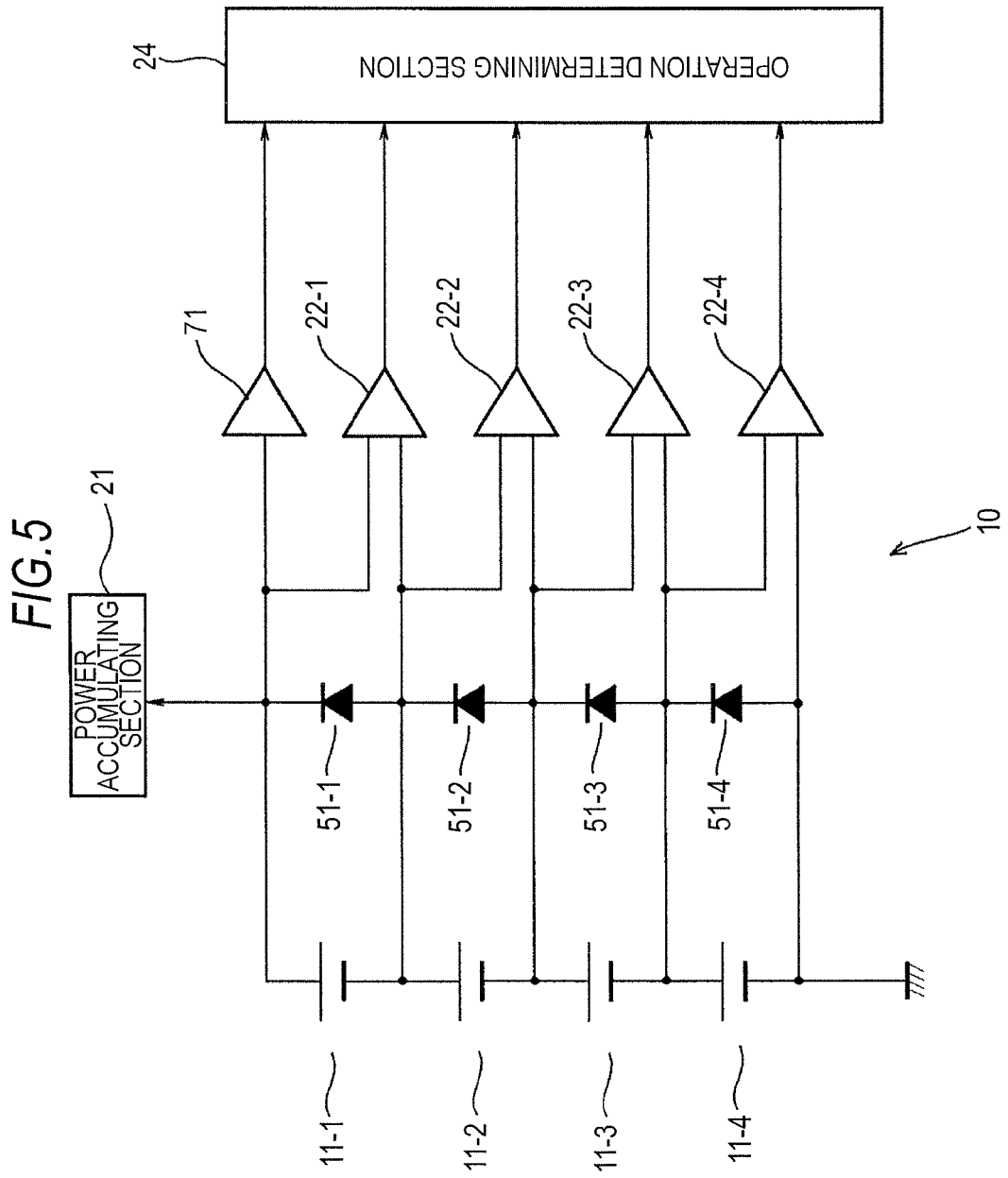
FIG. 5 is a diagram showing an exemplary circuit configuration of the mobile information processing apparatus.

In order to prevent such a situation, the mobile information processing apparatus 10 is provided with a circuit for monitoring the total voltage of the solar battery cells 11-1 to 11-4. FIG. 5 is a diagram showing a configuration of the mobile information processing apparatus 10 in which the circuit for monitoring the total voltage of the solar battery cells 11-1 to 11-4 is provided. The mobile information processing apparatus 10 shown in FIG. 5 is configured by adding a total voltage monitoring circuit 71 to a mobile information processing apparatus 10 as shown in FIG. 3.

The total voltage monitoring circuit 71 is connected to the positive side of the solar battery cell 11-1 and one end of the bypass diode 51-1. The total voltage monitoring circuit 71 is a circuit for monitoring the voltage supplied to the power accumulating section 21 or the total voltage of the solar battery cells 11-1 to 11-4. The result of the monitoring is supplied from the total voltage monitoring circuit 71 to the operation determining section 24. In a case wherein the result of monitoring supplied from the total voltage monitoring circuit 71 is lower than a predetermined voltage, even when it is determined that the solar battery cells 11-1 to 11-4 have been operated as switches, the process associated with the determination is not executed. In other words, the operation determining section 24 determines whether the solar battery cells 11-1 to 11-4 have been operated as switches and allows the process associated with the determination to be executed, when the result of monitoring supplied from the total voltage monitoring circuit 71 is equal to or higher than the predetermined voltage.

[Processes at Operation Determining Section]

Figure 6:
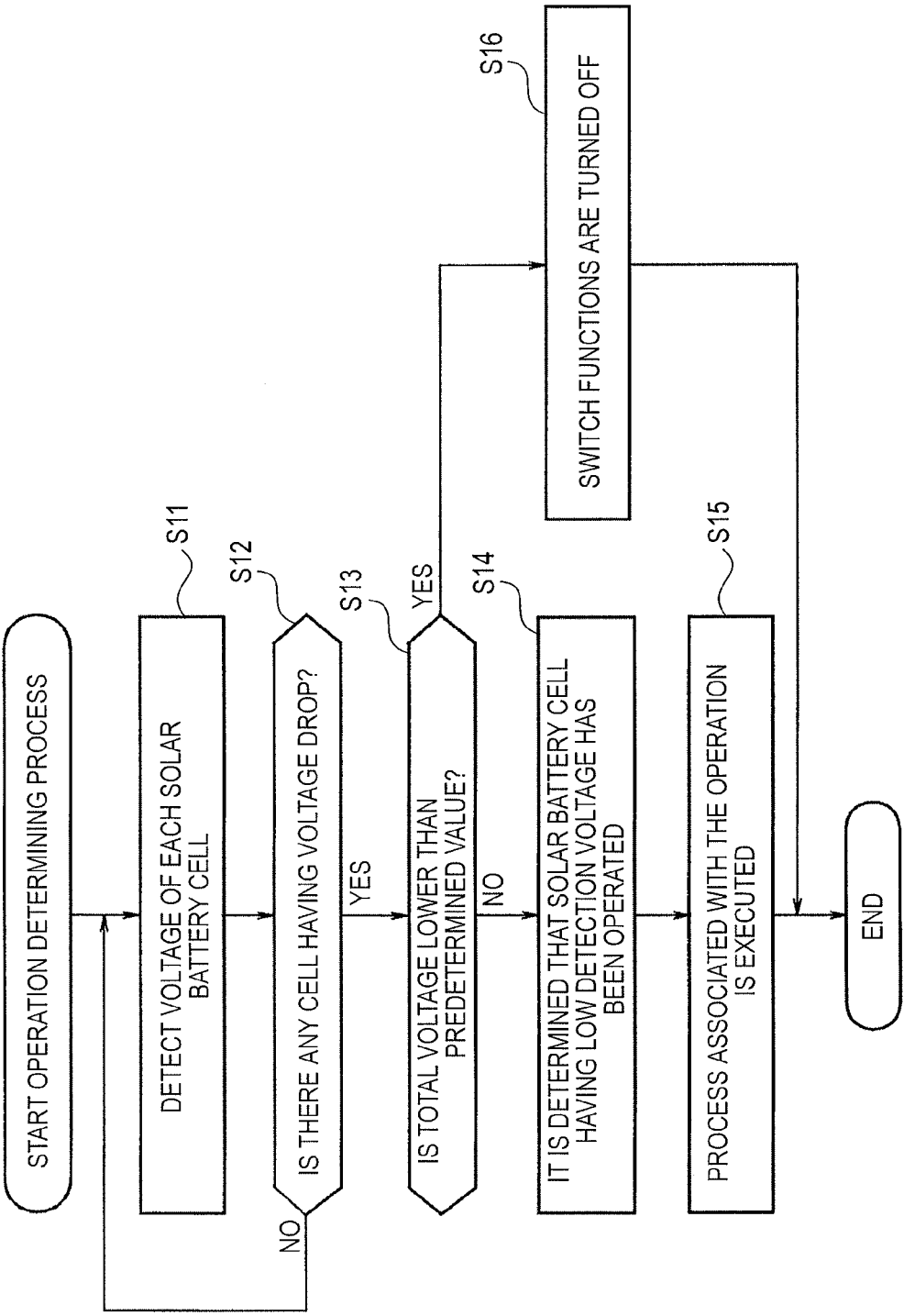
FIG. 6 is a flow chart for explaining processes associated with determination of an operation.

Processes performed by the operation determining section 24 of the mobile information processing apparatus 10 shown in FIG. 5 will now be described with reference to the flow chart of FIG. 6.

At step S11, the operation determining section 24 detects the voltages of the solar battery cells 11-1 to 11-4. The operation determining section 24 detects the voltages of the solar battery cells 11-1 to 11-4 from the values supplied by the respective cell voltage monitoring circuits 22-1 to 22-4. At step S12, it is determined whether there is any solar battery cell 11 whose voltage has dropped. The operation determining section 24 performs the process at step S12 by monitoring the values supplied from the cell voltage monitoring circuits 22-1 to 22-4 and determining whether any of the cell voltage monitoring circuits 22 has supplied the value "0".

When it is determined at step S12 that there is no solar battery cell 11 whose voltage has dropped, the process flow returns to step S11 to repeat the processes at steps S11 and S12. Specifically, it is determined that the solar battery cells 11 have not been operated as switches, and the processes at steps S11 and S12 are repeated until it is determined that any of the cells has been operated as a switch.

When it is determined at step S12 that there is a solar battery cell 11 whose voltage has dropped or when it is determined that there is a solar battery cell 11 which has been operated as a switch, the process flow proceeds to step S13. At step S13, it is determined whether the total voltage of the cells is lower than the predetermined value. The determination is carried out by the operation determining section 24 using the result of monitoring performed by the total voltage monitoring circuit 71. When it is determined at step S13 that the total voltage is not lower than the predetermined value, the process flow proceeds to step S14.

At step S14, it is determined that the solar battery cell 11 on which a voltage drop has been detected is a cell which has been operated. The operation determining section 24 identifies the solar battery cell 11 which has been operated by identifying the cell voltage monitoring circuit 22 outputting the value "0" (the value smaller than the predetermined value) among the cell voltage monitoring circuits 22-1 to 22-4.

At step S15, a process associated with the operation is executed. Specifically, the operation determining section 24 notifies the signal processing section 26 of the process associated with the solar battery cell 11 identified as having been operated. For example, the operation determining section 24 holds a table listing the solar battery cells 11-1 to 11-4 along with processes which are associated with the cells respectively. The section 24 refers to the table to read out the process associated with the solar battery cell 11 identified as having been operated and notifies the signal processing section 26 of the process thus read out. The signal processing section 26 executes the process based on the notice.

When the signal processing section 26 executes the process, for example, the display control section 27 controls the display 12 based on the result of the process input to the same. For example, when the solar battery cell 11-1 has been operated, the signal processing section 26 outputs image data A to the display control section 27, and the display control section 27 causes the display 12 to display an image associated with the image data A. For example, when the solar battery cell 11-2 has been operated, the signal processing section 26 outputs image data B to the display control section 27, and the display control section 27 causes the display 12 to display an image associated with the image data B.

When it is determined at step S13 that the total voltage is lower than the predetermined value, the process flow proceeds to step S16. At step S16, the cells are disabled from functioning as switches. Let us assume that the value monitored by a cell voltage monitoring circuit 22 is smaller than the predetermined value (specifically, the monitored value is "0") when the value monitored by the total voltage monitoring circuit 71 is smaller than the predetermined value. In such a case, the operation determining section 24 is restrained from determining that an operation has been performed on the solar battery cell 11 associated with the cell voltage monitoring circuit 22 outputting a value smaller than the predetermined value. Such control is exercised for the reasons described above.

The processes described above allow the solar battery cells 11 to be used not only as electric power sections generating and supplying electric power but also as user interfaces for accepting instructions from a user. Even when a solar battery cell 11 is used as a user interface and the cell therefore generates no electromotive force and functions as a pseudo-resistor, the above-described configuration prevents interruption of a current flow in the circuit. Thus, the accumulation of electric power in the power accumulation section 21 can be kept enabled.

Further, the use of the configuration for monitoring the total voltage of the cells makes it possible to prevent erroneous operations. Because of such a capability, the configuration allows more significant space savings to be achieved compared to configurations in which solar batteries are provided separately from user interfaces such as operation switches.

When the mobile information processing apparatus 10 has the configuration shown in FIG. 3, the processes at steps S13 and S16 are omitted. In the configuration shown in FIG. 3, for example, when results of monitoring performed by the cell voltage monitoring circuits 22-1 to 22-4 are lower than the predetermined value, the operation determining section 24 makes no determination (when all of the solar battery cells 11 have been operated, the monitoring result is treated as a command inhibiting any action), whereby the occurrence of an erroneous operation can be prevented.

[Another Configuration of Mobile Information Processing Apparatus]

Figure 7:
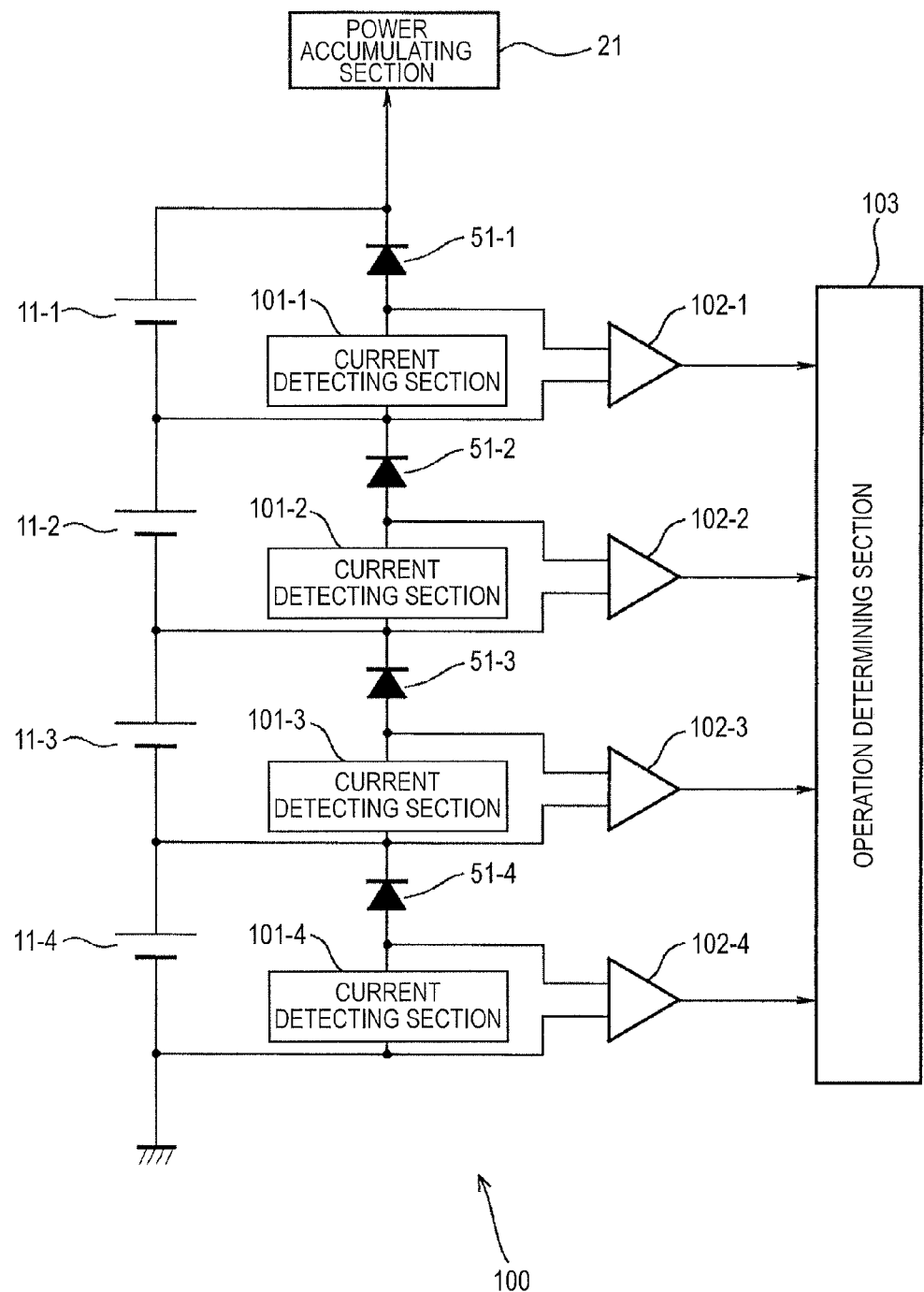
FIG. 7 is a diagram showing another exemplary circuit configuration of the mobile information processing apparatus.

FIG. 7 is a diagram showing another configuration of a mobile information processing apparatus. In the mobile information processing apparatus 10 described above and shown in, for example, in FIG. 3, voltages of electric power generated by the solar battery cells 11 are monitored by the cell voltage monitoring circuit 22 to identify any solar battery cell 11 which has been operated. Further, the apparatus has a configuration in which a current flows through a bypass diode 51 associated with a solar battery cell 11 when the cell is operated. It is therefore possible to provide a mobile information processing apparatus having such a configuration that a solar battery cell 11 is identified as having been operated when a current flows through a bypass diode 51 associated with the solar battery cell 11.

A mobile information processing apparatus 100 shown in FIG. 7 includes current detecting sections 101. The mobile information processing apparatus 100 shown in FIG. 7 also includes determination circuits 102-1 to 102-4 determining whether solar battery cells 11 have been operated or not by monitoring detection performed by the current detecting sections 101. Other parts of the apparatus are indicated by reference numerals identical to those used in the mobile information processing apparatus 10 shown in FIG. 3 and will not be described below because they are similar to the corresponding parts of the apparatus 10.

One end of a current detecting section 101-1 is connected to a negative side of a solar battery cell 11-1, and another end of the section is connected to one end of a bypass diode 51-1. One end of a current detecting section 101-2 is connected to a negative side of a solar battery cell 11-2, and another end of the section is connected to one end of a bypass diode 51-2. One end of a current detecting section 101-3 is connected to a negative side of a solar battery cell 11-3, and another end of the section is connected to one end of a bypass diode 51-3. One end of a current detecting section 101-4 is connected to a negative side of a solar battery cell 11-4, and another end of the section is connected to one end of a bypass diode 51-4.

The determination circuit 102-1 is connected to each of input and output sides of the current detecting section 101-1. The input side of the current detecting section 101-1 is on the negative side of the solar battery cell 11-1, and the output side of the section is connected to the bypass diode 51-1. Similarly, the determination circuit 102-2 is connected to each of input and output sides of the current detecting section 101-2. The determination circuit 102-3 is connected to each of input and output sides of the current detecting section 101-3. The determination circuit 102-4 is connected to each of input and output sides of the current detecting section 101-4.

Figure 8:
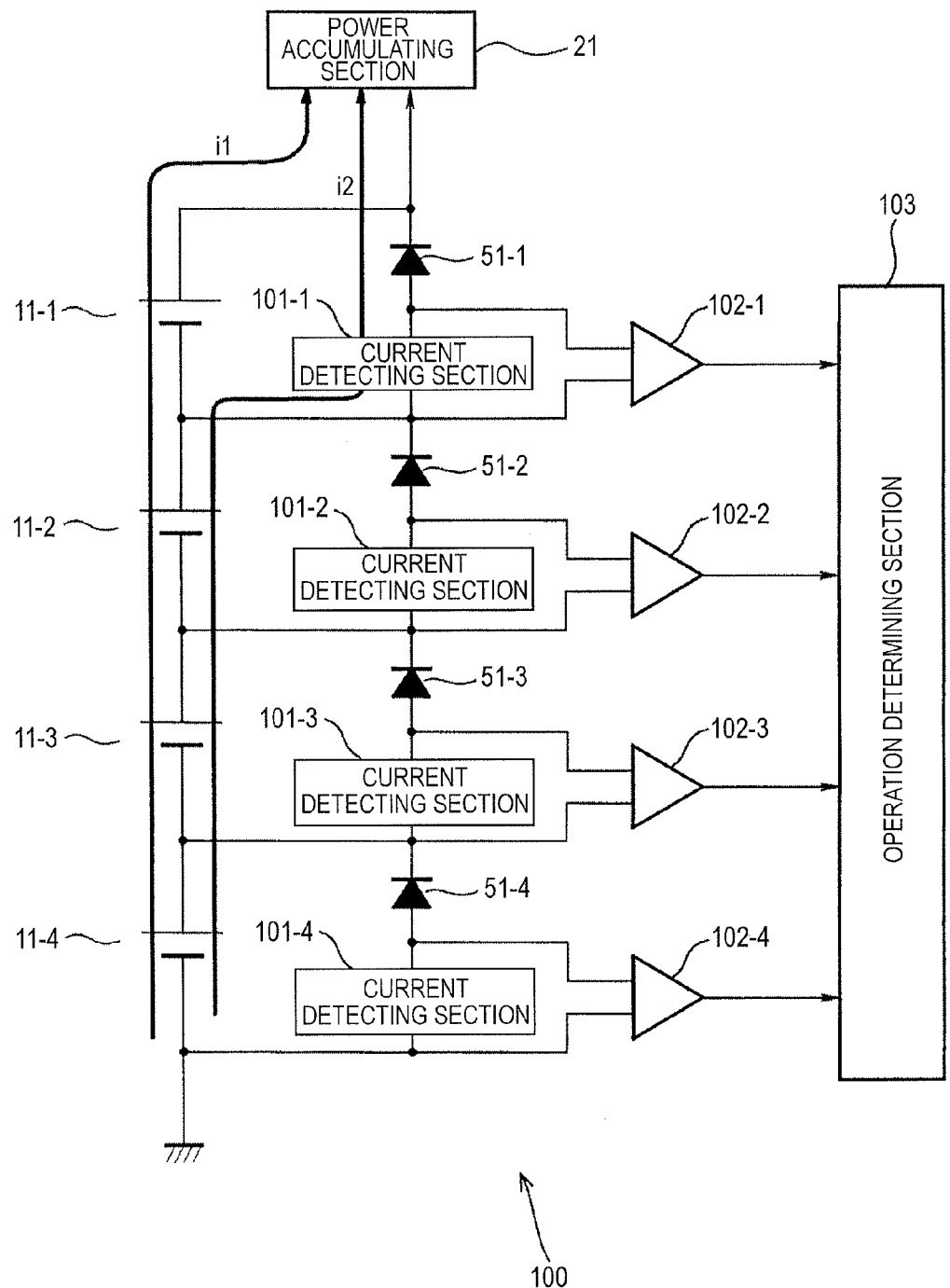
FIG. 8 is a diagram for explaining the flow of currents in the mobile information processing apparatus.

The flow of currents in the mobile information processing apparatus shown in FIG. 7 will now be described with reference to FIG. 8. When the solar battery cell 11-1 is not covered by a finger and is therefore generating an electromotive force, a current i1 flows into a power accumulating section 21 after flowing through the solar battery cell 11-4, the solar battery cell 11-3, the solar battery cell 11-2, and the solar battery cell 11-1, as shown in FIG. 8. When the solar battery cell 11-1 is covered by a finger, the solar battery cell 11-1 functions as a pseudo-resistor as shown in FIG. 8. When the solar battery cell 11-1 functions as a resistor, the current it does not flow through the solar battery cell 11-1. Consequently, no current flows into the power accumulating section 21, and no electric power is accumulated in the power accumulating section 21. In such a state, no electric power is supplied to the mobile information processing apparatus 100, and the apparatus is therefore disabled.

According to the embodiment of the invention, in order to prevent the occurrence of the state in which no current flows into the power accumulating section 21, the bypass diode 51-1 is provided to allow a current i2 to flow, as shown in FIG. 8. Specifically, when the solar battery cell 11-1 functions as a pseudo-resistor, the current i2 flows through the solar battery cell 11-4, the solar battery cell 11-3, the solar battery cell 11-2, and the bypass diode 51-1. As a result, the supply of electric power to the power accumulating section 21 can be maintained.

The current i2 flows through the current detecting section 101-1. Therefore, when the solar battery cell 11-1 has been operated, the current detecting section 101-1 detects the current i2. The determination circuit 102-1 can determine whether the solar battery cell 11-1 has been operated by monitoring the detection or determining whether the current has flowed through the current detecting section 101-1. Since determination is carried out in such a manner, the current detecting sections 101 may be formed by resistors (which preferably have a low resistance), and the determination circuits 102 may be configured to determine whether the current has flowed through the respective current detecting sections 101 by measuring potential differences between the resistors.

The determination circuits 102-2 to 102-4 determine that the respective solar battery cells 11-2 to 11-4 have been operated when the respective current detecting sections 101-2 to 101-4 detect the current, in the same manner as the determination circuit 102-1. The determination circuits 101-1 to 101-4 output the results of determination to an operation determining section 103. The operation determining section 103 identifies a solar battery cell 11 which has been operated based on the results of determination output from the determination circuits 101-1 to 101-4.

Figure 9:
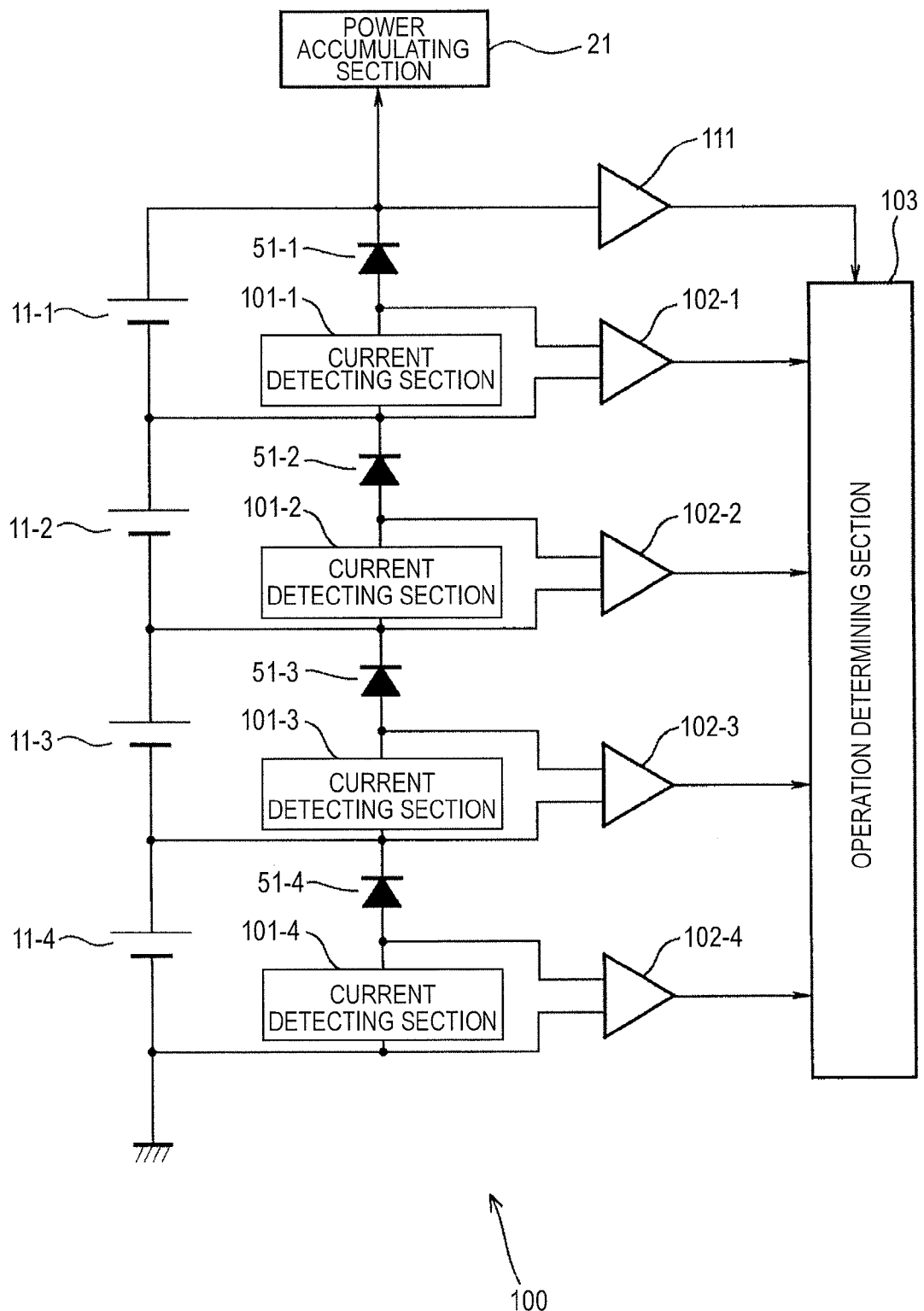
FIG. 9 is a diagram showing another exemplary circuit configuration of the mobile information processing apparatus.

The mobile information processing apparatus 100 may be configured such that the cells are disabled from functioning as switches when the total voltage of the cells has dropped. FIG. 9 shows an exemplary configuration of a mobile information processing apparatus 100 configured such that the cells are disabled from functioning as switches when the total voltage of the cells has dropped.

FIG. 9 is a diagram showing a configuration of the mobile information processing apparatus 100 in which a circuit for monitoring the total voltage (the total electromotive force) of the solar battery cells 11-1 to 11-4 is provided. The mobile information processing apparatus 100 shown in FIG. 9 is configured by adding a total voltage monitoring circuit 111 to a mobile information processing apparatus 100 as shown in FIG. 7.

The total voltage monitoring circuit 111 is connected to the positive side of the solar battery cell 11-1 and one end of the bypass diode 51-1. The total voltage monitoring circuit 111 is a circuit for monitoring the voltage supplied to the power accumulating section 21 or the total voltage of the solar battery cells 11-1 to 11-4. The result of the monitoring is supplied from the total voltage monitoring circuit 111 to the operation determining section 103. In a case wherein the result of monitoring supplied from the total voltage monitoring circuit 111 is lower than a predetermined voltage, even when it is determined that the solar battery cells 11-1 to 11-4 have been operated as switches, a process associated with the determination is not executed.

[Processes at Operation Determining Section]

Processes in the mobile information processing apparatus 100 shown in FIG. 9, in particular, processes performed by the operation determining section 103 will now be described with reference to the flow chart of FIG. 10.

At step S31, current detecting sections 101 detect currents flowing through themselves. When a current is detected by a current detecting section 101, a determination circuit 102 associated with the section determines that a current has flowed. The result of the determination is output to the operation determining section 103.

At step S32, the operation determining section 103 determines whether there is a determination circuit 102 which has determined the presence of a current flow. When it is determined at step S32 that there is no determination circuit 102 which has determined the presence of a current flow, the process flow returns to step S31 to repeat steps S31 and S32. That is, it is determined that the solar battery cells 11 have not been operated as switches, and the processes at steps S31 and S32 are repeated until it is determined that any of the cells has been operated as a switch.

When it is determined at step S32 that there is a determination circuit 102 which has determined the presence of a current flow or when it is determined that there is a solar battery cell 11 which has been operated as a switch, the process flow proceeds to step S33. At step S33, it is determined whether the total voltage of the cells is lower than a predetermined value. The determination is carried out by the operation determining section 103 using results of monitoring performed by the total voltage monitoring circuit 111. When it is determined at step S33 that the total voltage is not lower than the predetermined value, the process flow proceeds to step S34.

At step S34, the determination circuit 102 which has determined the presence of a current flow is identified, and the solar battery cell 11 associated with the determination circuit 102 is identified to be a cell which has been operated. At step S35, a process associated with the operation is executed. Specifically, the operation determining section 103 notifies the signal processing section 26 of a process associated with the solar battery cell 11 which has been identified as having been operated, and the signal processing section 26 executes the process.

When it is determined at step S33 that the total voltage is lower than the predetermined voltage, the process flow proceeds to step S36. At step S36, the cells are disabled from functioning as switches. Let us assume that the value monitored by a cell voltage monitoring circuit 22 is smaller than a predetermined value when the value monitored by the total voltage monitoring circuit 111 is smaller than the predetermined value. In such a case, the operation determining section 103 is restrained from determining that an operation has been performed on the solar battery cell 11 associated with the cell voltage monitoring circuit 22 outputting a value smaller than the predetermined value.

The processes described above allow the solar battery cells 11 to be used not only as electric power sections generating and supplying electric power but also as user interfaces for accepting instructions from a user. Even when a solar battery cell 11 is used as a user interface and the cell therefore generates no electromotive force and functions as a pseudo-resistor, the interruption of a current flow can be prevented in the circuit. Thus, the accumulation of electric power in the power accumulation section 21 can be kept enabled.

Further, the use of the configuration for monitoring the total voltage of the cells makes it possible to prevent erroneous operations. Because of such a capability, the configuration allows more significant space savings to be achieved compared to configurations in which solar batteries are provided separately from user interfaces such as operation switches.

The invention can be applied not only to mobile information processing apparatus like the present embodiment but also to any electronic apparatus having electric power generating elements represented by solar batteries.

The above-described series of processes may be executed on either hardware or software. When the series of processes is executed on a software basis, programs forming the software are installed in a computer. The invention may be implemented using computers including computers incorporated in dedicated hardware and general-purpose personal computers in which various programs can be installed to execute various functions.

Programs executed by such a computer may be programs for executing the processes described in this specification in a time sequential manner in the order in which the processes are described. Alternatively, it is possible to use programs executed in parallel or programs executed at appropriate timing as required such as when invoked.

In the present specification, the term "system" means the entirety of a complex apparatus formed by a plurality of apparatus.

The present application contains subject matter related to that disclosed in Japanese Priority Patent Application JP 2009-114194 filed in the Japan Patent Office on May 11, 2009, the entire contents of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. An apparatus comprising:
   a user interface including a plurality of electric power generating elements;
   a monitoring unit configured to monitor whether each electric power generating element in the plurality of electric power generating elements has an electromotive force of at least a first predetermined value;
   an identification unit configured to identify a first electric power generating element in the plurality of electric power generating elements having an electromotive force below the first predetermined value according to the monitoring unit; and
   a plurality of bypass units, including a first bypass unit in parallel with the first electric power generating element, wherein a current flows through the first bypass unit when the first electric power generating element identified by the identification unit has an electromotive force below the first predetermined value.

2. The apparatus according to claim 1, wherein the plurality of electric power generating elements are connected in series.

3. The apparatus according to claim 1, wherein the identification unit is further configured to identify a second electric power generating element in the plurality of electric power generating elements having an electromotive force below the first predetermined value according to the monitoring unit; and
wherein the current flows through a second bypass unit in the plurality of bypass units in parallel with the second electric power generating element when the second electric power generating element identified by the identification unit has an electromotive force below the first predetermined value.

4. The apparatus according to claim 3, further comprising:
   a controller configured to execute a process associated with the first electric power generating element and the second electric power generating element when the identification unit identifies each of the first electric power generating element and the second electric power generating element as having an electromotive force below the first predetermined value.

5. The apparatus according to claim 4, wherein the controller is further configured to change the process associated with the first electric power generating element and the second electric power generating element based on the order in which the identification unit identifies the first electric power generating element as having an electromotive force below the first predetermined value and the second electric power generating element as an electromotive force below the first predetermined value.

6. The apparatus according to claim 3, further comprising:
   a controller configured to execute a first process associated with the first electric power generating element when the identification unit identifies the first electric power generating element as having an electromotive force below the first predetermined value, and to execute a second process associated with the second electric power generating element when the identification unit identifies the second electric power generating element as having an electromotive force below the first predetermined value.

7. The apparatus according to claim 1, further comprising:
   a controller configured to execute a process associated with the first electric power generating element when the identification unit identifies the first electric power generating element as having an electromotive force below the first predetermined value.

8. The apparatus according to claim 7, wherein the controller is further configured to change the process associated with the first electric power generating element based on different applications to be executed.

9. The apparatus according to claim 7, wherein the controller is further configured to change the process associated with the first electric power generating element based on the number of times the first electric power generating element is determined to have an electromotive force below the first predetermined value.

10. The apparatus according to claim 7, further comprising:
    a total output monitoring unit configured to monitor a total electromotive force output from the plurality of electric power generating elements.

11. The apparatus according to claim 10, wherein the controller is further configured not to execute the process associated with the first electric power generating element when a result of the monitoring by the total output monitoring unit is lower than a second predetermined value.

12. The apparatus according to claim 7, wherein the controller is further configured to determine the process associated with the first electric power generating element based on a table.

13. The apparatus according to claim 1, further comprising a power accumulation unit configured to accumulate electric power generated by the plurality of electric power generating elements and to supply electric power to the apparatus.

14. The apparatus according to claim 1, further comprising a power accumulation unit configured to accumulate electric power from the current flowing through the first bypass unit when the first electric power generating element has an electromotive force below the first predetermined value and also flowing through at least a second electric power generating element in the plurality of electric power generating elements having an electromotive force of at least the first predetermined value.

15. The apparatus according to claim 1, wherein the first electric power generating element operates as a switch when the first electric power generating element has an electromotive force below the first predetermined value.

16. The apparatus according to claim 1, wherein the electric power generating elements are solar cells.

17. The apparatus according to claim 1, wherein the apparatus is a mobile phone.

* * * * *